United States Patent [19]

Proebsting

[11] 4,360,902
[45] Nov. 23, 1982

[54] SEMICONDUCTOR MEMORY DECODER WITH NONSELECTED ROW LINE HOLD DOWN

[75] Inventor: Robert J. Proebsting, Dallas, Tex.

[73] Assignee: Mostek Corporation, Carrollton, Tex.

[21] Appl. No.: 231,240

[22] PCT Filed: Jun. 2, 1980

[86] PCT No.: PCT/US80/00674
§ 371 Date: Jun. 2, 1980
§ 102(e) Date: Jun. 2, 1980

[87] PCT Pub. No.: WO81/03569
PCT Pub. Date: Dec. 10, 1981

[51] Int. Cl.³ .............................................. G11C 7/02
[52] U.S. Cl. .................................... 365/189; 365/203
[58] Field of Search ................ 365/189, 203, 204, 230

[56] References Cited
U.S. PATENT DOCUMENTS 3,980,899 9/1976 Shimada et al. ..................... 365/189
4,074,148 2/1978 Sato ..................................... 365/230
4,074,237 2/1978 Spampinato ........................ 365/189
4,259,731 3/1981 Moench .............................. 365/230

Primary Examiner—Stuart N. Hecker

[57] ABSTRACT

A semiconductor memory decoder (10) includes an OR gate (12) which receives a multi-bit memory address. A node (26) is precharged to a low state and driven to a high state when the OR gate (12) is not selected by the address. A node (34) is precharged to a high state and pulled to ground when the node (26) is driven to a high state. The high state precharged on the node (34) is conveyed to a node (40) which is connected to the gate terminal of a row driver transistor (54) and to a node (46) which is connected to the gate terminal of a row driver transistor (64). The one of the nodes (40,46) not connected to a selected row line is isolated from the node (34) to render conductive the corresponding nonselected row driver transistor (54,64). A high voltage state row driver signal (RD0,RD1) is transmitted through the selected row driver transistor (54,64) to charge the selected row line (56,66). A low voltage state row driver signal is transmitted through the nonselected row driver transistor (54,64) to hold the nonselected row line at ground.

8 Claims, 4 Drawing Figures

SEMICONDUCTOR MEMORY DECODER WITH NONSELECTED ROW LINE HOLD DOWN

TECHNICAL FIELD

The present invention pertains to semiconductor integrated circuits and more particularly to a semiconductor memory in which an unselected row line is held affirmatively to ground to reduce the effect of capacitive coupling from an adjacent selected row lines.

BACKGROUND ART

In a semiconductor memory each of the memory cells is accessed by applying a high voltage level to the row line that drives an access transistor for the addressed memory cells. The row line is activated by a decoder circuit which is driven by a multi-bit memory address signal. The row line selected by the address is driven to a high level by the decoder circuit. Heretofore, it has been a frequent practice to permit unselected row lines to float at times when another row line is selected by the decoder. But as memory circuits have become increasingly dense, there can be greater capacitive coupling between adjacent row lines. When a row line is charged or discharged, a voltage will be capacitively coupled into the adjacent floating row lines and the voltage thus coupled can turn on the access transistors from the memory cells connected to the floating row lines. This inadvertent activation of memory cells can destroy the data states stored therein. The most serious coupling occurs between immediately adjacent row lines. Thus, when these memory cells are later accessed, erroneous data will be read out.

In view of this problem, there exists a need for a circuit to drive the row line selected by the memory address to provide access to the memory cells along that row line, but at the same time to hold the nonselected adjacent row lines affirmatively to ground to prevent charging of a nonselected row line by capacitive coupling.

DISCLOSURE OF THE INVENTION

In a semiconductor memory having an array of row lines, a decoder circuit includes a row driver transistor for each of the row lines in the memory. Circuit means are provided for decoding an address signal for rendering conductive a selected row driver transistors and for rendering conductive the row driver transistor for the adjacent row line on either side of the row line corresponding to the selected row driver transistor. Circuit means are provided for generating a first row line signal for transmission through said selected row transistor to charge the selected row line. Further circuit means are provided for generating a second row line signal for transmission through the row driver transistors for said adjacent row lines to affirmatively hold said adjacent row lines to a low voltage state.

BRIEF DESCRIPTION OF THE DRAWINGS

For a more complete understanding of the present invention and the advantages thereof, reference is now made to the following taken into conjunction with the accompanying drawings is which.

DETAILED DESCRIPTION

Figure 1:
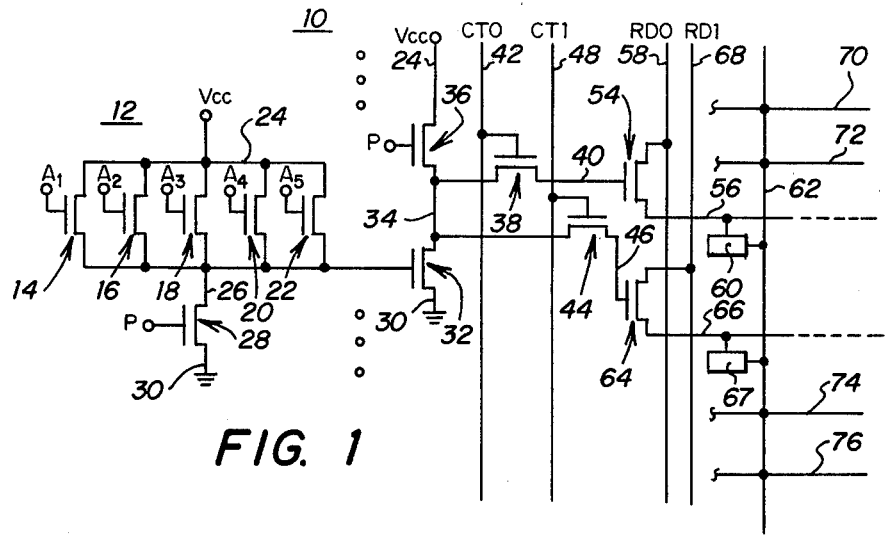
FIG. 1 is a schematic illustration of a decoder circuit for activating a selected row line in a semiconductor memory, and holding some unselected row lines, including the adjacent row lines, to ground.

Referring to FIG. 1 there is illustrated a decoder circuit in accordance with the present invention. The circuit 10 includes a decoder OR circuit 12 which comprises a plurality of input transistors 14–22. Each of the input transistors has a drain terminal thereof connected to a power terminal 24 which is in turn connected to the power source $V_{cc}$. The source terminals on the input transistors 14–22 are connected to a node 26. Address bits $A_1$–$A_5$ are provided respectively to the gate terminals of transistors 14–22.

A precharge transistor 28 has the drain terminal thereof connected to node 26, the source terminal thereof connected to a common ground node 30 and the gate terminal thereof connected to receive a precharge signal P. When the precharge signal is received the transistor 28 is made conductive thereby discharging node 26 to the ground node 30. When the precharge signal is terminated the transistor 28 is rendered nonconductive thereby leaving node 26 floating at ground potential.

Node 26 is connected to the gate terminal of a transistor 32 which has the source terminal thereof connected to the common node 30. The drain terminal of transistor 32 is connected to a node 34.

A precharge transistor 36 has the source terminal thereof connected to the node 34, the drain terminal thereof connected to the power terminal 24 and the gate terminal thereof connected to receive a precharge signal P.

Node 34 is connected to the drain terminal of a pass transistor 38 which has the source terminal thereof connected to a node 40 and the gate terminal thereof connected to a line 42 to receive a signal CT0.

Node 34 is further connected to the drain terminal of a transistor 44 which has the source terminal thereof connected to a node 46 and the gate terminal thereof connected to a line 48 to receive a signal CT1.

Node 40 is connected to the gate terminal of a row driver transistor 54 which has the source terminal thereof connected to a row line 56 and the drain terminal thereof connected to line 58 which receives a row driver signal RD0. The row line 56 has a plurality of memory cells such as 60 connected thereto for transferring data states to or from a bit line 62.

Node 46 is connected to the gate terminal of a row driver transistor 64 which has the source terminal thereof connected to a row line 66 and the drain terminal thereof connected to a line 68 which receives a row driver signal RD1. The row line 66 has a plurality of memory cells such as 67 connected thereto for transferring data states to or from bit line 62.

Within a semiconductor memory circuit the circuit 10 is provided for each pair of row lines within the memory. The row lines for a corresponding circuit above circuit 10 are labeled as 70 and 72. The row lines for a corresponding circuit below circuit 10 are labeled as 74 and 76. The row lines 56, 66, 70, 72, 74 and 76 are layed out in an array within a semiconductor memory.

In dense memory circuits the row lines are spaced closely together such that when one row line is charged or discharged a voltage can be capacitively coupled into the immediately adjacent row lines.

In the semiconductor memory having a plurality of circuits 10 the signal RD0 is connected to alternate row lines across the array of row lines and the signal RD1 is connected to the other alternate row lines in the array.

Figure 2:
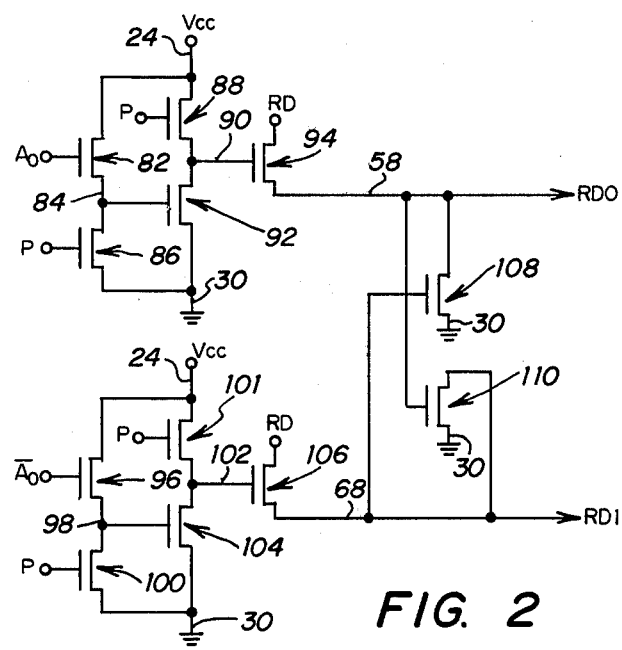
FIG. 2 is a schematic illustration of a circuit generating the RD0 and RD1 signals utilized in the circuit of FIG. 1.

The circuit for generating the row driver signals RD0 and RD1 is illustrated in FIG. 2. The memory address bit $A_0$ is provided to the gate terminal of a transistor 82 which has the source terminal thereof connected to a node 84 and the drain terminal thereof connected to the power terminal 24. A precharge signal P is provided to the gate terminal of a transistor 86 which has the source terminal thereof connected to the common node 30 and the drain terminal thereof connected to node 84.

A precharge signal P is provided to the gate terminal of a transistor 88 which has the source terminal thereof connected to a node 90 and the drain terminal thereof connected to the power terminal 24.

Node 84 is connected to the gate terminal of a transistor 92 which has the source terminal thereof connected to the common node 30 and the drain terminal thereof connected to node 90.

The node 90 is connected to the gate terminal of a transistor 94, which has the drain terminal thereof connected to receive a row driver clock signal RD. The row driver signal RD0 is generated at the source terminal of transistor 94 and transmitted through line 58.

In a similar circuit to that described immediately above the complement of the $A_0$ address bit is provided to the input terminal of a transistor 96 which has the source terminal thereof connected to a node 98 and the drain terminal thereof connected to the power terminal 24. The precharge signal P is supplied to the gate terminal of a transistor 100 which has the source terminal thereof connected to the common node 30 and the drain terminal thereof connected to node 98. The precharge signal P is also supplied to the gate terminal of a transistor 101 which has the source terminal thereof connected to a node 102 and the drain terminal thereof connected to the power terminal 24. Node 98 is further connected to the gate terminal of a transistor 104 which has the source terminal thereof connected to the common ground node 30 and the drain terminal thereof connected to the node 102.

The node 102 is connected to the gate terminal of a transistor 106 which has the source terminal thereof connected to line 68 and the drain terminal thereof connected to receive the row drive clock signal RD. The row driver signal RD1 is generated at the source terminal of transistor 106 and transmitted through line 68.

The row driver signals RD0 and RD1 are cross-coupled through transistors 108 and 110. The gate terminal of transistor 108 is connected to line 68 and the gate terminal of transistor 110 is connected to line 58. The drain terminal of transistor 108 is connected to line 58 and the drain terminal of transistor 110 is connected to line 68. The source terminals for both transistors 108 and 110 are connected to the common ground node 30. When signal RD0 is at a high voltage level transistor 110 is turned on thereby pulling signal RD1 to ground. Likewise, when signal RD1 is at a high voltage state the transistor 108 is turned on thereby pulling signal RD0 to ground. Thus when either of the signals RD0 or RD1 has been driven to a high level the other of the row driver signals is pulled to ground.

Figure 3:
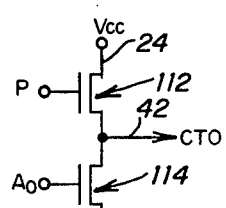
FIG. 3 is a schematic illustration of a circuit for generating a CT0 signal utilized in the circuit of FIG. 1.

The signal CT0 is generated by circuit illustrated in FIG. 3. A precharge signal P is provided to the gate terminal of a transistor 112 which has the source terminal thereof connected to line 42 and the drain terminal thereof connected to the power terminal 24. The address bit $A_0$ is supplied to the gate terminal of a transistor 114 which has the source terminal thereof connected to the common ground node 30 and the drain terminal thereof connected to line 42. The signal CT0 is generated at line 42. When the precharge signal P goes to a high state the transistor 112 is turned on thereby precharging line 42 and driving signal CT0 to a high state. When address bit $A_0$ is at a high state the transistor 114 is turned on thereby discharging line 42 and pulling the signal CT0 to a low voltage state.

Figure 4:
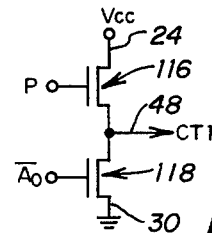
FIG. 4 is a schematic illustration of a circuit for generating the signal CT1 which is utilized in the circuit of FIG. 1.

The circuit for generating signal CT1 is illustrated in FIG. 4. A precharge signal P is provided to the gate terminal of a transistor 116 which has the source terminal thereof connected to line 48 and the drain terminal thereof connected to the power terminal 24. The complement of the $A_0$ address bit is supplied to the gate terminal of a transistor 118 which has the source terminal thereof connected to the common ground node 30 and the drain terminal thereof connected to line 48. The signal CT1 is generated on line 48. When the precharge signal P goes to a high state the transistor 116 is turned on thereby precharging line 48 which drives signal CT1 to a high voltage state. When the complement of the $A_0$ address bit goes to a high voltage level the transistor 118 is turned on thereby discharging line 48 and pulling the signal CT1 to a low voltage level.

The operation of the circuit which generates the RD0 and RD1 signals is now described in reference to FIG. 2. Upon receipt of the precharge signal P transistors 86 and 88 are rendered conductive. Node 84 is pulled to ground potential through transistor 86 and node 90 is charged to a high voltage potential through transistor 88. When the precharge signal goes to a low level, node 84 is left floating at ground potential since the $A_0$ address bit is at a low level and transistor 82 is turned off. Node 90 is left floating at a high potential when the precharge signal goes to a low level because the ground potential on node 84 turns off transistor 92.

If the address bit $A_0$ goes to a high level the transistor 82 is turned on thereby charging node 84 to a high potential. When node 84 is thus charged transistor 92 is rendered conductive to discharge node 90 and turn off transistor 94. When transistor 94 is turned off the row driver clock signal RD cannot be transmitted to line 58.

If the $A_0$ address bit is received at a low level transistor 82 is maintained nonconductive and the charge state on nodes 84 and 90 are not changed. Transistor 94 is rendered conductive by the high voltage state on node 90 such that the row driver clock signal RD is transmitted to line 58 to produce the signal RD0.

The RD1 is generated in this same manner as the signal RD0 by the circuit in the lower half of FIG. 2.

As noted above, the signals RD0 and RD1 are cross-coupled through transistors 108 and 110 such that when one of the signals is driven to a high level the other signal is pulled to ground potential.

Operation of the circuit of the present invention is now described in reference to FIG. 1. The precharge signal turns on transistor 28 to discharge node 26 and subsequently turns off transistor 28 so that node 26 floats at ground potential. The decoder circuit 12 receives various combinations of the address bits $A_1$–$A_5$. If any one of the address bits $A_1$–$A_5$ goes to a high level the corresponding input transistor is turned on thereby charging node 26 to a high voltage state. If none of the address bits $A_1$–$A_5$ goes to a high level, the node 26 is maintained at ground potential.

The precharge signal P turns on transistor 36 to precharge node 34 to a high voltage state. This occurs before the start of each memory cycle. When the address bits $A_1$–$A_5$ do not select the decoder circuit 12 the node 26 is pulled to a high voltage state which turns on transistor 32 thereby discharging node 34 to ground. Thus, node 34 is held at a high voltage state when the address bits $A_1$–$A_5$ select decoder 12 but node 34 is discharged when the address bits do not select decoder 12.

When the node 34 is being precharged the signals CT0 and CT1 are also being precharged to a high level thereby turning on pass transistors 38 and 44. Thus when node 34 is charged, nodes 40 and 46 are likewise charged. Transistor 54 is rendered conductive when node 40 is at a high voltage state and transistor 64 is likewise rendered conductive when node 46 is at a high voltage state. When transistors 54 and 64 are turned on the corresponding row drive signals RD0 and RD1 are coupled through the row driver transistors to the respective row lines 56 and 66.

The signal CT0 or CT1 is driven to a low voltage state before node 34 can be discharged. Transistor 114 and 118 is rendered conductive when the $A_0$ address bit, or its complement, reaches one threshold voltage level. But node 34 cannot be discharged until one of the $A_1$–$A_5$ address bits has risen to at least two threshold voltages since one threshold voltage is required to turn on one of the input transistors and node 26 must be driven to at least one threshold voltage to turn on transistor 32. Thus either transistor 38 and 44 is turned off before node 34 can be discharged.

The address bit $A_0$ determines whether signal RD0 or signal RD1 is driven to a high voltage state. This high voltage state serves to charge one of the row lines 56 or 66 to a high state thereby accessing the memory cells connected thereto. When one of the row driver signals is selected and driven to a high state, the other row driver signal is pulled to ground and this ground state is transmitted through the conductive row driver transistor to the corresponding row line thereby holding that row line to ground. When such a row line is held at ground any charge capacitively coupled to the row line is discharged to ground.

Referring to FIG. 1 a memory cycle sequence is accomplished as follows. The node 34 is initially charged to a high voltage state by transistor 36. At this time signals CT0 and CT1 are at a high level thereby turning on transistors 38 and 44 which serves to precharge nodes 40 and 46 to a high level. This operation is carried out for all pairs of row lines within the memory. Thus the same operation is being carried out for the decoder circuits (not shown) for the row lines 70 and 72 and the row lines 74 and 76.

After nodes 26, 34, 40, 42, 46, 48, 84, 90, 98 and 102 have been precharged as described above and the address bit $A_0$ is received in the low state, the following operation occurs. Referring to FIG. 2, since node 84 is at ground, transistor 92 is not conductive and node 90 remains high. When control signal RD goes high, RD0 follows RD high because transistor 94 is conductive. When $A_0$ is low $\overline{A}_0$ is high so that node 98 is brought high by transistor 96. This turns on transistor 104 discharging node 102 which turns off transistor 106. When transistor 106 is off RD1 does not follow RD high. Further, when RD0 goes high RD1 is held at ground due to conduction through transistor 110.

Referring to FIG. 3, when $A_0$ is low CT0 remains high. Referring to FIG. 4, when $\overline{A}_0$ is high, CT1 is quickly discharged to ground. CT1 is discharged to ground when $\overline{A}_0$ reaches one threshold voltage. At this time, the remaining addresses are either still at ground (FIG. 1) or are at only one threshold voltage. Thus node 26 is just starting to rise and transistor 32 is not yet conductive. Even if one or more addresses $A_1$–$A_5$ goes high, CT1 is discharged more quickly than node 34 is discharged so node 46 is isolated at a high level. With node 46 left high, transistor 64 is conductive, providing a conductive path from row line 66 to node 68. Since RD1 is held to ground when $A_0$ is low, row line 66 is provided with a positive hold down. Further, since all alternate row lines also connected to node 68, all of the corresponding alternate row lines are held to ground. In the case when $A_0$ is low, row lines 72 and 76, in addition to row line 66, are held to ground. The selected row line, wherever it is, must be between two row lines each of which are held to ground.

Still referring to FIG. 1, if none of the addresses $A_1$–$A_5$ goes high, node 26 remains at ground so transistor 32 remains off. Node 34 then remains high so that node 40 also remains high. When RD0 goes high, transistor 54 is rendered conductive so that row line 56 follows RD0 high. This is the case for the selected row. If, on the other hand, one or more of the addresses $A_1$–$A_5$ goes high, node 26 is driven to a high voltage state, and transistor 32 discharges node 34. Since CT0 remains high, node 40 is also discharged so transistor 54 is not conductive. When RD0 goes high, row line 56 remains at ground although it is floating rather than being held to ground.

Thus, it can be seen that for every combination of address bits one half of the row lines in the memory circuit will be held affirmatively to ground. These include the row lines on either side of the selected row line.

In FIG. 1 five address bits of the memory address are supplied to select the discharge node 34 while the remaining address bit $A_0$ is utilized to select either of the row lines 56 or 66. It is within the scope of the present invention that any number of address bits can be utilized for selecting one row line within a group of row lines. For example, if two address bits are used for selecting among the row lines within a group, there can be four row lines within a group and at least the adjacent row lines to the selected row line are pulled to ground.

Although one embodiment of the invention has been illustrated in the accompanying drawings and described in the foregoing detailed description, it will be understood that the invention is not limited to the embodiments disclosed, but is capable of numerous rearrangements, modifications and substitutions without departing from the scope of the invention.

I claim:

1. In a semiconductor memory having an array of row lines, a decoder circuit comprising:
   a row driver transistor for each of said row lines;
   means for decoding an address signal for rendering conductive a selected one of said row driver transistors;
   means responsive to said address signal for rendering conductive the row driver transistor for the adjacent row line on either side of the row line corresponding to said selected row driver transistor;

means responsive to said address signal for generating a first row driver signal for transmission through said selected row driver transistor to charge the row line connected thereto; and means responsive to said address signal for generating a second row driver signal for transmission through the row driver transistors for said adjacent row lines to affirmatively hold said adjacent row lines to a low voltage state.

2. The decoder circuit recited in claim 1 wherein said means for decoding comprises:

an OR gate having a plurality of input terminals connected respectively to receive a first set of address bits selected from said address, and having an output terminal which is driven to a high voltage state when said OR gate is not selected by said first set of address bits and said OR gate output terminal is held at a low voltage state when said OR gate is selected by said first set of address bits;

an inverter having an input terminal and an output terminal, the input terminal thereof connected to the output terminal of said OR gate;

a pass transistor for each said row driver transistor, each pass transistor connected to the output of said inverter and the corresponding row driver transistor; and means for decoding a second set of address bits for rendering conductive the one of said pass transistors connected to the row driver transistor selected by said second set of address bits.

3. The decoder circuit recited in claim 1 wherein said means for rendering conductive comprises:

means for precharging to a high voltage state each of the gate terminals of said row driver transistors; and means responsive to said address signal for trapping said high voltage state on the gate terminals of the row driver transistor on each side of the row driver transistor selected by said address signal.

4. In a semiconductor memory having an array of row lines, a decoder circuit comprising:

a row driver transistor for each of said row lines;

means for decoding an address signal for rendering conductive a selected one of said row driver transistors;

means responsive to said address signal for rendering conducting every other row driver transistors in said array to include the row driver transistor on each side of said selected row driver transistor;

means responsive to said address signal for generating a first row driver signal for transmission through said selected row driver transistor to charge the row line connected thereto; and means responsive to said address signal for generating a second row driver signal for transmission through said every other row driver transistors to affirmatively hold the row line connected thereto to a low voltage state.

5. In a semiconductor memory where a multi-bit address is decoded to charge one of a plurality of row lines for accessing memory cells connected to the charged row line, a circuit comprising:

means responsive to a precharge signal for charging a first node to a first state, said first node corresponding to a group of said row lines;

means responsive to a first set of address bits selected from said address for driving said first node to a second state when said first set of address bits does not select said group of row lines;

means responsive to a second set of address bits selected from said address for generating a row driver signal for each of the row lines within said group and for driving to a high voltage state the one of said row driver signals selected by said second set of address bits;

means for driving to a low voltage state the row driver signals for the row line on each side of the row line selected by said second set of address bits;

a second node for each of said row lines within said group of row lines;

means for connecting said first node to each of said second nodes upon receipt of a precharge signal for charging said second nodes to said first state;

means responsive to said second set of address bits for connecting to said first node the second nodes corresponding to the row lines selected by said second set of address bits and for isolating from said first node the second nodes corresponding to the row lines not selected by said second set of address bits; and means for coupling each of said row driver signals to the corresponding row line when the corresponding second node is charged to said first state.

6. In a semiconductor memory where a multi-bit address is decoded to charge a selected one of a plurality of row lines for accessing memory cells connected to the selected row line, a circuit comprising:

a plurality of input transistors, the gate terminal of each input transistor connected to receive a respective bit of said address, the drain terminals of said input transistor connected to a positive power terminal and the source terminals of said input transistor connected to a first node;

a first transistor having the drain terminal thereof connected to said first node, the source terminal thereof connected to a common node and the gate terminal thereof connected to receive a precharge signal;

a second transistor having the drain terminal thereof connected to said power terminal, the gate terminal thereof connected to receive said precharge signal and the source terminal thereof connected to a second node;

a third transistor having the gate terminal thereof connected to said first node, the drain terminal thereof connected to said second node and the source terminal thereof connected to said common node;

a fourth transistor corresponding to a first one of said row lines within a pair of said row lines, said fourth transistor having the drain terminal thereof connected to said second node, the source terminal thereof connected to a third node and the gate terminal thereof connected to receive a CT0 signal;

a fifth transistor corresponding to the second one of said row lines in said pair of row lines, said fifth transistor having the drain terminal thereof connected to said second node, the source terminal thereof connected to a fourth node and the gate terminal thereof connected to receive CT1 signal;

means responsive to a given bit of said address for generating said CT0 signal;

means responsive to said given bit for generating said CT1 signal;

a first row driver transistor having the gate terminal thereof connected to said third node, the source terminal thereof connected to said first one of said row lines and the drain terminal thereof connected to receive an RD0 signal;

a second row driver transistor having the gate terminal thereof connected to said fourth node, the source terminal thereof connected to said second one of said row lines and the drain terminal thereof connected to receive a RD1 signal;

means responsive to said given address bit for generating said RD0 signal; and means responsive to said given address bit for generating said RD1 signal.

7. In a semiconductor memory having an array of row lines, a method for charging a row line selected by a multi-bit memory address for accessing memory cells on the selected row line while holding certain nonselected row lines at ground, the method comprising the steps of:

decoding the memory address and rendering conductive a row driver transistor connected to the selected row line;

decoding a set of address bits selected from said memory address and rendering conductive the row driver transistor for the row line on each side of the selected row line;

generating a first row driver signal having a high voltage state and transmitting said first row driver signal through said row driver transistor connected to said selected row line for charging said selected row line; and generating a second row driver signal having a low voltage state and transmitting said second row driver signal through said row driver transistors connected to the row line on each side of the selected row line for holding the row line on each side of the selected row line at ground.

8. In a semiconductor memory having an array of row lines, a method for charging a row line selected by a multi-bit memory address for accessing memory cells on the selected row line while holding certain nonselected row lines at ground, the method comprising the steps of:

decoding the memory address and rendering conductive a row driver transistor connected to the selected row line;

decoding a set of address bits selected from said memory address and rendering conductive the row driver transistors for every other row lines in said array to include the row line on each side of the selected row line;

generating a first row driver signal having a high voltage state and transmitting said first row driver signal through said row driver transistor connected to said selected row line for charging said selected row line; and generating a second row driver signal having a low voltage state and transmitting said second row driver signal through said row driver transistor for every other row line for holding said every other row line at ground.

* * * * *